United States Patent
Van Zon

(10) Patent No.: US 6,911,709 B1
(45) Date of Patent: Jun. 28, 2005

(54) METHOD OF MANUFACTURING A MAGNETIC TUNNEL JUNCTION DEVICE

(75) Inventor: Joannes Baptist Adrianus Dionisius Van Zon, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 260 days.

(21) Appl. No.: 09/787,838
(22) PCT Filed: Jul. 17, 2000
(86) PCT No.: PCT/EP00/06817
§ 371 (c)(1), (2), (4) Date: Mar. 22, 2001
(87) PCT Pub. No.: WO01/08176
PCT Pub. Date: Feb. 1, 2001

(30) Foreign Application Priority Data

Jul. 22, 1999 (EP) ............................................ 99202417

(51) Int. Cl.⁷ ............................................. H01L 29/82
(52) U.S. Cl. ........................................ 257/421; 365/173
(58) Field of Search ........................................... 257/421

(56) References Cited

U.S. PATENT DOCUMENTS 5,637,906 A * 6/1997 Konno ........................ 257/421
5,650,958 A * 7/1997 Gallagher et al. .......... 365/173

FOREIGN PATENT DOCUMENTS

| WO | WO 99/22368 | * 5/1999 | |
| WO | WO9922368 | 5/1999 | ............ G11B/5/39 |

* cited by examiner

*Primary Examiner*—Douglas A. Wille
(74) *Attorney, Agent, or Firm*—Michael E. Belk

(57) ABSTRACT

A method of manufacturing a magnetic tunnel junction device, in which a stack (1) comprising two electrode layers (3, 7) and a barrier layer (5) extending in between is formed. One of the electrode layers is structured by means of etching, in which, during etching, a part of this layer is made thinner by removing material until a rest layer (7r) remains. This rest layer is subsequently removed by means of physical etching, in which at least substantially charged particles have a motion energy which is between the sputtering threshold of the magnetic material of the rest layer and the sputtering threshold of the non-magnetic material of the barrier layer. In the relevant method, it is prevented that the electrode layer which is not to be structured is detrimentally influenced during structuring of the other electrode layer.

16 Claims, 2 Drawing Sheets

METHOD OF MANUFACTURING A MAGNETIC TUNNEL JUNCTION DEVICE

TECHNICAL FIELD

The invention relates to a method of manufacturing a magnetic tunnel junction device, in which a stack comprising two electrode layers, comprising a magnetic material, and a barrier layer extending in between, comprising a non-magnetic material, is formed.

The invention also relates to a magnetic tunnel junction device obtainable by means of such a method, a magnetic field sensor provided with such a device and a magnetic memory provided with such a device.

SUMMARY OF THE INVENTION

A device as described above is disclosed in WO-A 99/22368. The magnetic tunnel junction device known from said patent application comprises a first and a second magnetic layer, which layers are sandwiched with respect to an insulating intermediate layer and serve as electrode layers. As a transducing element, this device forms part of a magnetic field sensor provided with a magnetic yoke, in which the first magnetic layer is in direct contact with a part of the yoke. The first magnetic layer, likewise as the yoke, is formed from a soft-magnetic material. The second magnetic layer is a composite layer and comprises a ferromagnetic sub-layer and a pinning structure. The insulating intermediate layer constitutes a tunnel barrier.

In the known magnetic tunnel junction device, one of the magnetic layers, namely the soft-magnetic layer, therefore also serves as a flux guide. To prevent detrimental effects on the magnetical properties of this layer, such as domain wall formation due to irregularities in the surface of the soft-magnetic layer facing the tunnel barrier, it is desirable that only the other magnetic layer, i.e. the second magnetic layer, and possibly the barrier-forming intermediate layer, is, or are, structured.

It is an object of the invention to provide a method of the type described in the opening paragraph, comprising a process of structuring one of the electrode layers, which process stops with certainty before the other electrode layer is reached.

To achieve the object described, the method according to the invention is characterized in that one of the electrode layers is structured by means of etching, in which, during etching, a part of the relevant layer is made thinner by removing material until a rest layer remains, whereafter this rest layer is removed by means of physical etching, in which at least substantially particles have a motion energy which is between the sputtering threshold of the magnetic material of the rest layer and the sputtering threshold of the non-magnetic material of the barrier layer. Physical etching is understood to mean etching by means of a beam of electrically charged particles, such as sputter etching, ion milling and ion beam etching. As is assumed to be known, the sputtering threshold is the minimal energy which is necessary to release a particle from the material of the layer which is subjected to an etching process.

In the method according to the invention, it is with certainty that the other electrode layer is not reached because the electrode layer to be structured is not entirely etched off during a first phase of the etching process in which use is made in known manner of a mask of the electrode layer to be structured which is or may comprise a soft-magnetic layer. Etching during the first phase may be chemical or physical etching. By performing, for example, resistance measurements, it can be determined when the rest layer is reached. Preferably, a rest layer having a thickness of maximally 5 nm is aimed at. During a second phase of the etching process, the rest layer is removed by way of physical etching without the other electrode layer being attacked. This surprising effect is achieved in that the particles used during physical etching have a motion energy which is lower than the sputtering threshold of the barrier layer and can therefore not pass through the barrier layer. The physical etching process used is thus a selective etching process. The steps of the method mentioned above do not cause any detrimental effect on the non-structured electrode layer; particularly there is no detrimental influence of the magnetical properties of this electrode layer. If the last-mentioned layer is formed from or also from a soft-magnetic material, this layer is particularly suitable for use as a flux-guiding layer.

An embodiment of the method according to the invention is characterized in that particles are used which have a mass which is heavier than the mass of a metallic element of the magnetic material of the rest layer. In this case, it is assumed that the mass of the elements of the non-magnetic material, generally an oxide or a nitride, of the barrier layer is lighter than the mass of said metallic element. The measure mentioned above positively contributes to the selectivity of the method, in which the selectivity of etching the magnetic material is higher with respect to the non-magnetic material as the charged particles have a heavier mass.

An embodiment of the method according to the invention is characterized in that the electrode layer to be structured is built up from, consecutively, a basic layer and a layer structure comprising at least a further layer for magnetic pinning of the basic layer. The basic layer may be a ferromagnetic layer, for example, of an NiFe alloy or a Co alloy, particularly a Co-Fe alloy, while the pinning layer structure may comprise one of the following possibilities: an anti-ferromagnetic layer of, for example, an FeMn alloy or an IrMn alloy; a hard-magnetic ferromagnetic layer of, for example, a Co alloy; an artificial anti-ferromagnetic structure comprising two anti-parallel magnetic layers separated by a metallic intermediate layer. Such a structure may be coupled to an anti-ferromagnetic layer of, for example, an FeMn alloy. If such an electrode layer to be structured is formed, it is preferred to selectively etch the layer structure, particularly selectively chemically etch this structure initially, i.e. before the basic layer is structured, until the basic layer is reached. By making partly use of said selective etching, the structuring process in accordance with the method according to the invention can be performed within a shorter period of time. Selective chemical etching is a known etching technique.

It is to be noted that the method according to the invention implies a method of structuring a magnetic electrode layer of a semi-manufactured product of a magnetic tunnel junction device, in which the semi-manufactured product comprises an assembly of said electrode layer, a barrier layer and a further magnetic electrode layer. In the last-mentioned method, the structuring of the relevant layer does not influence the magnetical properties of the other magnetic electrode layer of the magnetic tunnel junction device, at least not in a detrimental sense. The special aspect of this method is that etching does not take place through the barrier layer. It is thereby ensured that, in spite of layer thickness variations and variations of etching methods, the magnetic electrode layer, which is not to be structured, is not etched. The barrier layer, which is an insulating layer, a layer having a low electrical conductance, or a dielectric layer, is usually only approximately 1 nm thick.

The magnetic tunnel junction device according to the invention, manufactured by means of the method according to the invention, has a magnetic electrode layer structured by means of the last-mentioned method and another magnetic electrode layer which may be or may comprise a soft-magnetic layer, which layer is usable as a flux guide. Such a soft-magnetic layer may be formed from, for example, an NiFe alloy or a Co alloy such as a Co-Fe alloy. The soft-magnetic layer may also be built up from a number of sub-layers.

The magnetic field sensor according to the invention is provided with the magnetic tunnel junction device according to the invention. The magnetic tunnel junction device forms one or the transducing element of the magnetic field sensor according to the invention. This sensor may be used, inter alia, as a magnetic head for decoding magnetic flux originating from a magnetic information medium such as a magnetic tape or a magnetic disc; as a sensor in compasses for detecting the earth's magnetic field; as a sensor for detecting, for example, a position, an angle, or a velocity, for example, in automotive uses; as a field sensor in medical scanners; and as a current detector. Also the magnetic memory, particularly a MRAM, according to the invention is provided with the magnetic tunnel junction device according to the invention.

With regard to the claims, it is to be noted that various combinations of the embodiments mentioned in the dependent claims are possible.

These and other aspects of the invention are apparent from and will be elucidated with reference to the embodiments described hereinafter.

DETAILED DESCRIPTION OF THE INVENTION

Figure 1A:
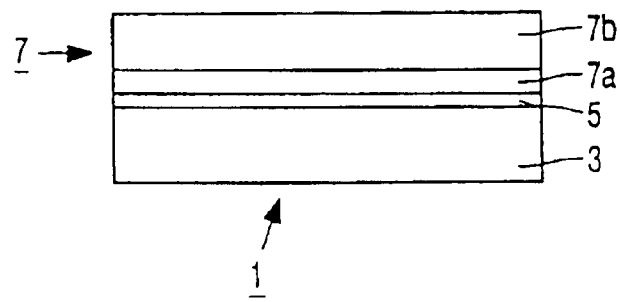
FIG. 1A shows diagrammatically a first intermediate product obtained from an embodiment of the method according to the invention.

FIG. 1A shows a stack 1 of layers which comprises, in this example, a first magnetic electrode layer 3 of a soft-magnetic material, such as an NiFe alloy, an insulating, poorly conducting or dielectric layer 5, in this document also referred to as barrier layer, of, for example $Al_2O_3$, a second magnetic electrode layer 7 built up in this example of a basic layer 7a of a soft-magnetic material, in this example an NiFe alloy, and a layer structure 7b comprising at least a further layer of an anti-ferromagnetic material such as an FeMn alloy. Alternatively, a hard-magnetic layer may be used as a second magnetic layer for the layer structure comprising the basic layer 7a and the layer structure 7b.

Figure 1B:
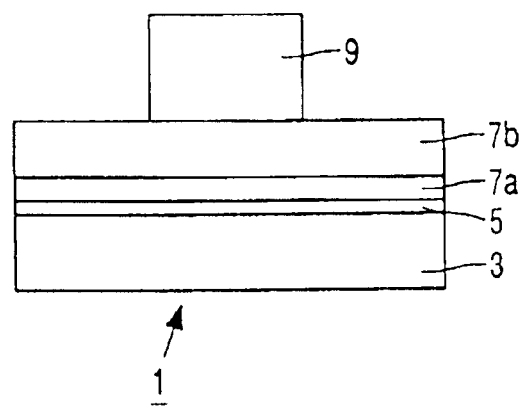
FIG. 1B shows diagrammatically a second intermediate product obtained from said embodiment of the method according to the invention.
Figure 1C:
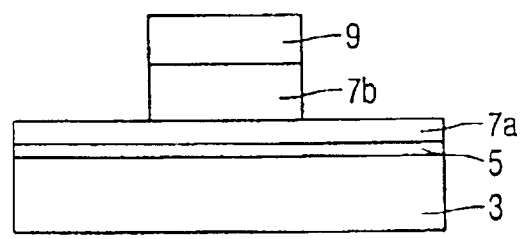
FIG. 1C shows diagrammatically a third intermediate product obtained from the embodiment of the method according to the invention.
Figure 1D:
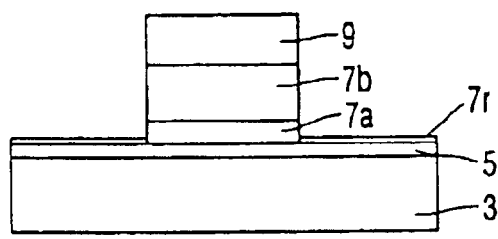
FIG. 1D shows diagrammatically a fourth intermediate product according to the invention.

During the method according to the invention, a shielding layer 9 of, for example, a photoresist, see FIG. 1B, is provided on the stack 1 shown. Subsequently, etching processes are used, in which the layer structure 7b is first etched selectively, particularly etched chemically, until the basic layer 7a is reached; see FIG. 1C. Subsequently, the basic layer 7a is etched, particularly etched physically, until a rest layer 7r of soft-magnetic material remains; see FIG. 1D. Alternatively, instead of two etching processes, it may be sufficient to use physical etching only. Physical etching such as sputter etching is preferably also used if the second electrode layer 7 is a hard-magnetic layer. During physical etching, resistance measurements are performed continuously or occasionally, possibly during a short interruption of the etching process, so as to determine when the desired rest layer 7r is reached.

The rest layer 7r obtained in one of the methods described above preferably has a thickness of 5 nm maximum. During the method according to the invention, the rest layer 7r is removed by physical etching, in this example sputter etching, in which charged particles, particularly ions, have a motion energy which is between the sputtering threshold of the NiFe alloy used and the sputtering threshold of $Al_2O_3$. The sputtering threshold of the NiFe alloy is approximately 20 eV; the sputtering threshold of $Al_2O_3$ is approximately 40 eV. In this embodiment, the rest layer 7r is preferably bombarded with Kr or Xe ions which ions have a mass which is heavier than the mass of the metals Ni and Fe, which mass is in its turn heavier than the mass of Al and O. After removal of the rest layer 7r, a protective layer 11 may be formed by depositing an insulating material such as $SiO_2$ or $Al_2O_3$. The shielding layer 9 may be removed.

Figure 1E:
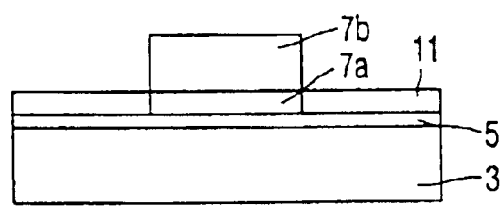
FIG. 1E shows diagrammatically an embodiment of the magnetic tunnel junction device according to the invention, made in accordance with the described embodiment of the method according to the invention.
Figure 2:
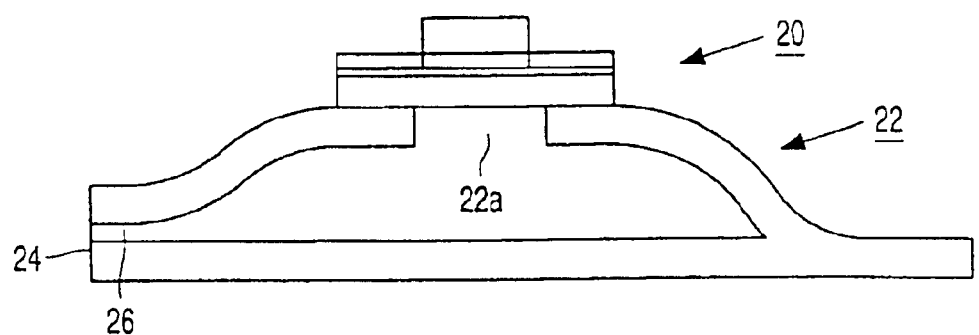
FIG. 2 shows an embodiment of the magnetic field sensor according to the invention.

The magnetic field sensor according to the invention, shown in FIG. 2, comprises a magnetic tunnel junction device 20 of the type shown in FIG. 1E. In this embodiment, the sensor also comprises a magnetic yoke 22 which has an interruption 22a which is bridged and is in magnetic contact with the tunnel junction device 20. The magnetic yoke 22 is formed from a soft-magnetic material such as an NiFe alloy. The sensor has a sensor face 24 adjacent to a non-magnetic transducing gap 26. The interruption 22a and the gap 26 are formed by insulating layers of, for example $SiO_2$ or $Al_2O_3$.

It is to be noted that the invention is not limited to the embodiments shown. For example, variants of the several steps of the method are possible within the scope of the invention. Furthermore, the sensor shown may be formed as a magnetic head for scanning a magnetic recording medium. Such a construction may form part of a combined read/write head. The magnetic tunnel junction device obtained in accordance with the method of the invention may also form part of a magnetic memory.

What is claimed is:

1. A magnetic device, comprising:
   an first electrode layer including a first magnetic material;
   an insulating layer on the first electrode layer; and
   a second electrode layer including at least one magnetic material, wherein the second electrode layer comprises a basic layer on the insulating layer and a layer structure on the basic layer, wherein the basic layer includes a central portion and a peripheral portion, wherein the central portion and the peripheral portion are each in direct mechanical contact with the insulating layer, wherein the peripheral portion circumscribes the central portion and is integral with the central portion, wherein the thickness of the peripheral portion is less than the thickness of the central portion, and wherein the layer structure effectuates a magnetic pinning of the basic layer.

2. The magnetic device of claim 1, wherein the insulating layer comprises a non-magnetic material element, and wherein the mass of the non-magnetic element is less than the mass of a metallic element of the second magnetic material.

3. The magnetic device of claim 1, wherein the first magnetic material comprises a first soft-magnetic material.

4. The magnetic device of claim 3, wherein the at least one magnetic material comprises:

a second soft-magnetic material in the central portion of the basic layer;

the second soft-magnetic material in the peripheral portion basic layer; and an anti-ferromagnetic material in the layer structure.

5. The magnetic device of claim 3, wherein the at least one magnetic material comprises:

a second soft-magnetic material in the central portion of the basic layer;

the second soft-magnetic material in the peripheral portion basic layer; and a hard-magnetic material in the layer structure.

6. The magnetic device of claim 3, wherein the at least one magnetic material comprises:

a ferromagnetic material in the central portion of the basic layer; and the ferromagnetic material in the peripheral portion basic layer.

7. The magnetic device of claim 3, wherein the basic layer comprises a ferromagnetic material, and wherein the layer structure comprises an artificial anti-ferromagnetic structure comprising two anti-parallel magnetic layers separated by a metallic intermediate layer.

8. The magnetic device of claim 1, further comprising a protective layer of insulative material on the insulating layer, wherein the protective layer circumscribes the basic layer, and wherein the protective layer is in direct mechanical contact with the basic layer and with the insulating layer.

9. The magnetic device of claim 8, wherein the thickness of the protective layer is less than the thickness of the second electrode layer.

10. The magnetic device of claim 1, further comprising:

a magnetic yoke in magnetic contact with the first electrode.

11. The magnetic device of claim 10, wherein the magnetic yoke comprises an interruption that includes an insulating material, and wherein the interruption directly contacts a portion of a surface of the first electrode layer.

12. The magnetic device of claim 11, wherein the magnetic yoke further comprises a non-magnetic transducing gap that includes the insulating material.

13. The magnetic device of claim 10, further comprising a protective layer of insulative material on the insulating layer, wherein the protective layer circumscribes the second electrode layer, wherein the protective layer is in direct mechanical contact with both the insulating layer and the second electrode layer, and wherein the thickness of the protective layer is less than the thickness of the second electrode layer.

14. The magnetic device of claim 1, wherein the first magnetic material comprises a first soft-magnetic material, and wherein the at least one magnetic material comprises a second soft-magnetic material in the basic layer and an anti-ferromagnetic material in the layer structure.

15. The magnetic device of claim 1, wherein the first magnetic material comprises a first soft-magnetic material, and wherein the at least one magnetic material comprises a second soft-magnetic material in the basic layer and a hard-magnetic material in the layer structure.

16. The magnetic device of claim 1, wherein the basic layer comprises a ferromagnetic material, and wherein the layer structure comprises an artificial anti-ferromagnetic structure comprising two anti-parallel magnetic layers separated by a metallic intermediate layer.

* * * * *